(12) United States Patent
Teo et al.

(10) Patent No.: US 7,816,274 B2
(45) Date of Patent: Oct. 19, 2010

(54) METHODS FOR NORMALIZING STRAIN IN A SEMICONDUCTOR DEVICE

(75) Inventors: Lee Wee Teo, Singapore (SG); Chung Foong Tan, Singapore (SG); Alain Chan, Ap Lei Chau (HK); Elgin Kiok Boone Quek, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 245 days.

(21) Appl. No.: 12/057,072

(22) Filed: Mar. 27, 2008

(65) Prior Publication Data

US 2009/0246920 A1 Oct. 1, 2009

(51) Int. Cl.
*H01L 21/302* (2006.01)

(52) U.S. Cl. .................. 438/744; 438/187; 257/E21.64; 257/E21.633

(58) Field of Classification Search .................. 438/744
See application file for complete search history.

(56) References Cited

U.S. PATENT DOCUMENTS

| 2005/0020022 A1* | 1/2005 | Grudowski | 438/305 |
|---|---|---|---|
| 2005/0035470 A1* | 2/2005 | Ko et al. | 257/900 |
| 2005/0258515 A1* | 11/2005 | Chidambarrao et al. | 257/649 |
| 2007/0111538 A1 | 5/2007 | Iyer et al. | |
| 2008/0087965 A1* | 4/2008 | Chen et al. | 257/368 |

OTHER PUBLICATIONS

Yuan, et al., "A 45nm low cost low power platform by using integrated dual-stress-liner technology", Symposium on VLSI Technology Digest of Technical Papers, 2006.

* cited by examiner

*Primary Examiner*—Ajay K Arora
(74) *Attorney, Agent, or Firm*—Brinks Hofer Gilson & Lione

(57) ABSTRACT

The electrical performance enhancing effects of inducing strain in semiconductor devices is made substantially uniform across a substrate having a varying population density of device components by selectively spacing apart the strain-inducing structures from the effected regions of the semiconductor devices depending upon the population density of device components. Differing separation distances are obtained by selectively forming sidewall spacers on device components, such as MOS transistor gate electrodes, in which the sidewall spacers have a relatively small width in regions having a relatively high density of device components, and a relatively larger width in regions having a relatively low density of device components. By varying the separation distance of strain-inducing structures from the effected components, uniform electrical performance is obtained in the various components of the devices in an integrated circuit regardless of the component population density.

19 Claims, 3 Drawing Sheets

METHODS FOR NORMALIZING STRAIN IN A SEMICONDUCTOR DEVICE

TECHNICAL FIELD

The present invention relates, generally, to semiconductor device fabrication and, more specifically, to methods for fabricating devices in which the electrical performance of semiconductor devices is enhanced by inducing strain in the substrate.

BACKGROUND

As ultra-large-scale-integrated-circuits (ULSI) circuits are scaled to smaller dimensions, continued improvement in device drive current is necessary. In a metal-oxide-semiconductor (MOS) device, for example, drive current is determined, in part, by gate length, gate capacitance, and carrier mobility. At a given device size, improved device current can be obtained by increasing the carrier mobility.

A widely used technique to enhance carrier mobility includes forming a strained silicon channel region in an MOS transistor. Strain or stress in the silicon crystal lattice can enhance bulk electron and hole mobility through the lattice. The formation of a strained silicon region for fabrication of the transistor channel is a relatively straight forward way to improve device performance without introducing process scaling complexity.

A common practice used to create strain in a silicon lattice is to form a layer of material adjacent to the silicon channel region that has a lattice constant that differs from silicon. Both silicon germanium (SiGe) and silicon carbide (SiC) have been used in MOS device fabrication. Since the lattice constant of SiGe is larger than that of silicon, the lattice mismatch puts the silicon under tension and the charge carrier mobility increases though the strained silicon lattice. Similarly, the lattice constant of SiC differs from silicon, however, the type of strain created by SiC differs from that created by SiGe. Alloys such as SiGe create compressive strain in silicon, while SiC creates tensile strain in silicon. A bi-axial, in-plane tensile strain field can improve performance in N-type MOS devices, and compressive strain parallel to channel length direction can improve performance in P-type MOS devices.

Strain can also be applied by forming a strain-inducing layer, such as an etch-stop layer, on the gate electrode and the source and drain regions of an MOS device. Materials such as strained silicon nitride induce strain in the underlying silicon regions due to the compressive force of the silicon nitride layer on the underlying silicon. Highly strained silicon nitride layers have been used as etch stop layers or sidewall spacers to introduce strain in the channel regions of MOS transistors.

While both of the above methods have found application for creating strained silicon devices, these methods suffer from non-uniform stress fields across a device caused by localized differences component density. In particular, regions of a device having a high density population of device components, such as MOS transistors, exhibit lower drive current than MOS transistors in substrate regions having a lower transistor population density. For example, the effect of compressive strain from an etch-stop layer is much more pronounced on silicon regions having a low transistor density as compared to regions having relatively high transistor density.

FIG. 1(a) is a plot of on-current versus threshold saturation voltage for isolated verses densely populated transistors. FIG. 1(b) is a plot of off-current versus on-current for isolated verses densely populated transistors. The difference in the degree of stress applied by the etch stop layer results in a variance in electrical performance of these transistors by as much as 8 percent.

Shown in FIG. 2, in cross-section, are two regions of a semiconductor substrate 10 arranged in accordance with the prior art and populated with MOS transistors. A first region 12 of semiconductor substrate 10 includes gate electrodes 14 having a first lateral spacing $D_1$. A second device region 18 includes gate electrodes 20 having a second lateral spacing $D_2$. Gate electrodes 14 and 20 include sidewall spacers 22 on the vertical walls of the gate electrodes. The sidewall spacers can be formed, for example, by depositing a layer of spacer-forming material and anisotrophically etching the spacer-forming material.

In accordance with one of the strain-inducing methods described above, a compressive layer 24 is deposited to overlie the device structures in first region 12 and second region 18 of semiconductor substrate 10. Compressive layer 24 will enhance the electrical performance of the transistors by inducing strain in the channel regions of the transistors underlying the gate electrodes. The plots shown in FIGS. 1(a) and 1(b) are representative of the variance in transistor performance obtained by the MOS transistors shown in FIG. 2. In FIGS. 1(a) and 1(b), the plot identified as "Isolated" corresponds to transistors in first region 12 device, and the plot identified as "Dense" corresponds to the electrical performance of transistors in second region 18. As described above, the variance in electrical performance of the transistors in regions 12 and 18 of semiconductor substrate 10 is related to the non-uniform strain created in regions 12 and 18 by compressive layer 24.

Accordingly, a need exists to normalize the stress in device components of varying population density, so as to improve the performance uniformity of devices employing strained silicon technology.

SUMMARY

In one embodiment, a method for fabricating semiconductor devices includes providing a substrate having a first region including device structures and a second region including device structures. The first region is more densely populated with device structures than the second region. Sidewall spacers are formed on the device structures in the first and second regions, where the sidewall spacers in the second region have a lateral dimension that is larger than the sidewall spacers in the first region.

In another embodiment, a method for normalizing stress in a semiconductor device substrate includes providing a substrate populated by relatively high density device structures and relatively low density device structures. A stain-inducing material is formed in proximity to the device structures, where the stain-inducing material is in closer proximity to the relatively high density device structures than the relatively low density device structures.

In yet another embodiment, a method for fabricating semiconductor devices includes providing a substrate including N-type transistors and P-type transistors. A first region of the substrate is more densely populated with transistors than a second region of the substrate. Sidewall spacers are formed on gate electrodes of the transistors, where the sidewall spacers in the second region have a lateral dimension that is larger than the sidewall spacers in the first region. A stain-inducing material is formed in proximity to gate electrodes of the transistors, where the stain-inducing material is spaced apart from the gate electrodes by the sidewall spacers.

DETAILED DESCRIPTION

Figure 3:
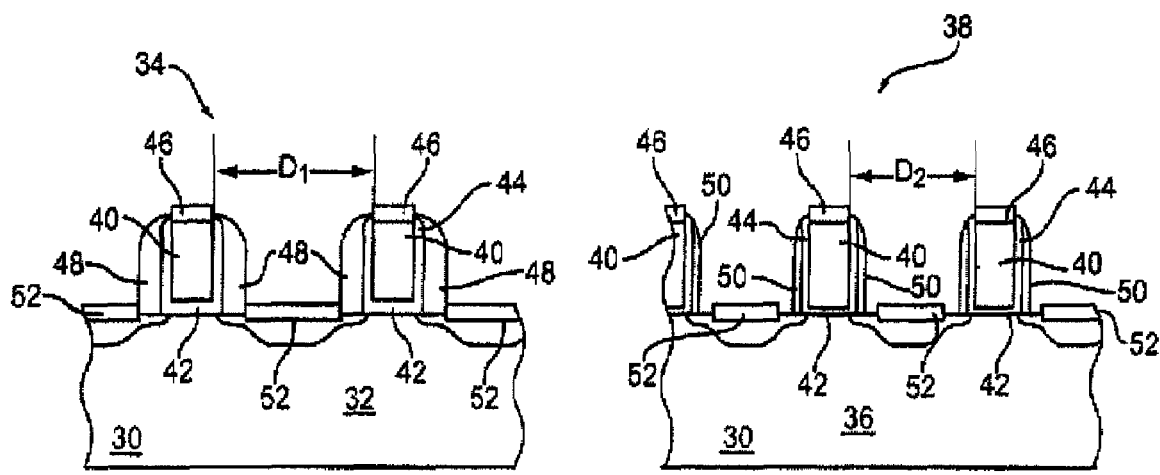
FIGS. 3 and 4, illustrate, in cross-section, process steps in accordance with one embodiment of the invention.
Figure 4:
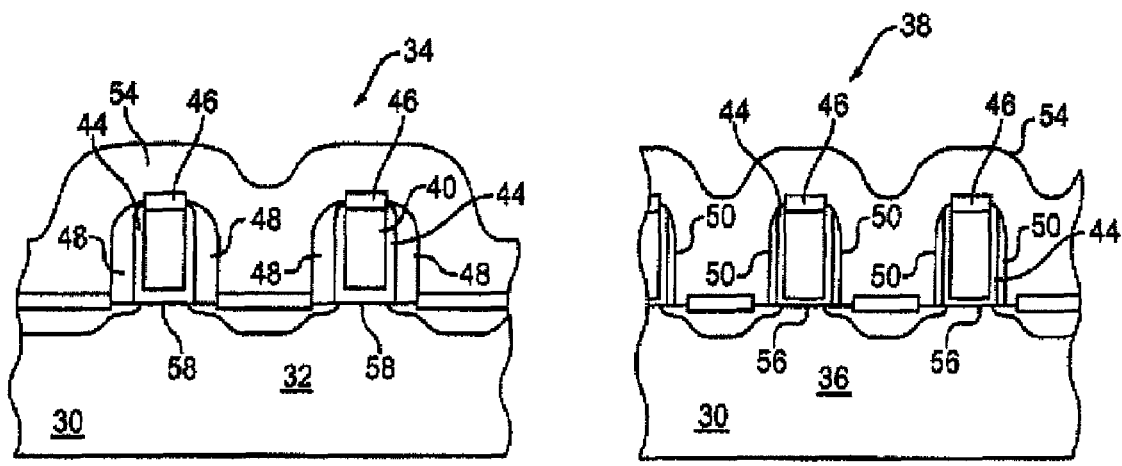

In accordance with one aspect of the invention, the non-uniform electrical performance described above is addressed by the fabrication process illustrated in FIGS. 3 and 4. FIG. 3 illustrates, in cross-section, two regions of a semiconductor substrate 30 having already undergone several processing steps in accordance with the invention. A first region 32 includes MOS transistors 34 separated by a first lateral distance $D_1$, and second region 36 includes MOS transistors 38 separated by a second lateral distance $D_2$. Second substrate region 36 is more densely populated with MOS transistors than is first substrate region 32. MOS transistors 34 and 38 are fabricated using conventional processing steps to form gate electrodes 40 overlying the substrate 30 and separated therefrom by a gate dielectric layer 42. Gate electrodes 40 have an insulating liner 44 along the vertical sidewalls of the gate electrode and a silicide contact region 46 formed at the upper surface of the gate electrodes. Each of the gate electrodes also include sidewalls spacers formed on the sidewalls of gate electrodes 40 and separated from the sidewalls by the liner 44.

As illustrated in FIG. 3, sidewall spacers 48 on the gate electrodes and first substrate region 32 are larger than sidewall spacers 50 on the gate electrodes in second substrate region 36. Accordingly, the lateral distance, or width, of sidewall spacers 48 along the surface of first substrate region 32 is larger than the lateral distance, or width, of sidewall spacers 50 along the surface of second substrate region 36.

In accordance with one aspect of the invention, sidewall spacers 48 and 50 are formed by conformally depositing a layer of spacer material on substrate 30 and overlying gate electrodes 40. Then, the spacer material is anisotrophically etched to remove the spacer material from horizontal surfaces, while leaving portions of the spacer material on vertical surfaces.

After forming silicide regions 46 on gate electrodes 40 and silicide regions 52 on portions of substrate 30 intermediate to the gate electrodes, a second etching process is carried out to selectively reduce the size of the sidewall spacers in second substrate region 36, while not substantially reducing the size of the sidewall spacers in first substrate region 32. In one aspect, the second etching process is carried out such that the etch rate is higher in regions of the substrate more densely populated with device structures than in corresponding regions of the substrate having lower device structure population density. Preferably, the selective etching process is carried out by chemical etching using fluorine-based etchants, such as, for example, $CH_2F_2$, $CF_4$, and $O_2$. Due the dense nature of the features in substrate region 36, it is harder for etchants to remove the nitride at the dense area as compared to isolated area.

Source and drain regions and extension regions are formed in substrate 30 using conventional semiconductor fabrication methods.

In accordance with another process embodiment, following the deposition of spacer material, a single etching process is carried out to form sidewall spacers 48 and 50. The etching process is configured to more rapidly etch the spacer material in second substrate region 36, as compared to the etching rate of spacer material in first substrate region 32. Those skilled in the art will appreciate that electrical contact enhancing structures, such as silicide regions 46 and 52, are optional and can be formed at different stages of an MOS device fabrication process. For example, silicide regions 52 can be formed before forming the sidewall spacers.

Following the formation of sidewall spacers, a strain-inducing layer 54 is deposited to overlie substrate 30 including the gate structures residing in first substrate region 32 and second substrate region 36. Preferably, strain-inducing layer 54 is a layer of high-tensile silicon nitride. The silicon nitride induces a compressive stress in first and second substrate regions 32 and 36. Preferably, strain-inducing layer 54 is deposited to a thickness of about 200 angstroms to about 1000 angstroms. Since sidewall spacers 50 have a smaller width than sidewall spacers 48, strain-inducing layer 54 resides in close proximity to channel regions 56 in second substrate region 36. In contrast, stain-inducing layer 54 is spaced apart from channel regions 58 in first substrate region 32 by relatively wider sidewall spacers 48. Since the width of sidewall spacers 48 is greater than the width of sidewall spacers 50, strain-inducing layer 54 is more distantly spaced away from channel regions 58 than from channel regions 56.

By differentially separating the strain-inducing layer from the channel regions of MOS transistors in different regions of a substrate, the enhanced electrical performance of the transistors caused by inducing strain in the substrate, can be made uniform across the substrate. The transistor performance uniformity is achieved despite the difference in population density of device structures in different regions of the substrate. Accordingly, in the context of the exemplary embodiment described above, densely populated MOS transistors 38 will exhibit similar electrical performance to relatively low-density MOS transistors 34.

Figure 5:
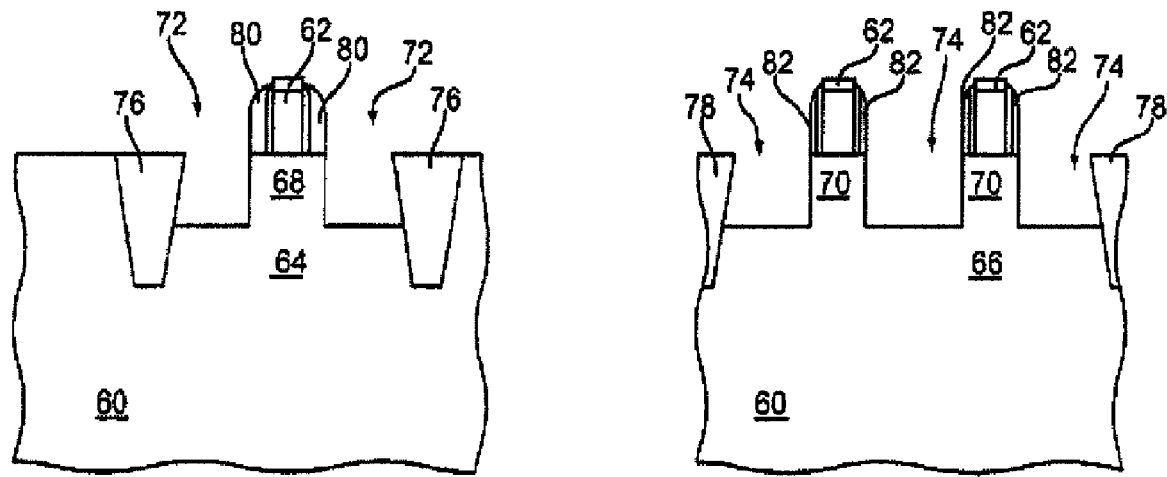
FIGS. 5-6, illustrate, in cross-section, process steps in accordance with another embodiment of the invention.
Figure 6:
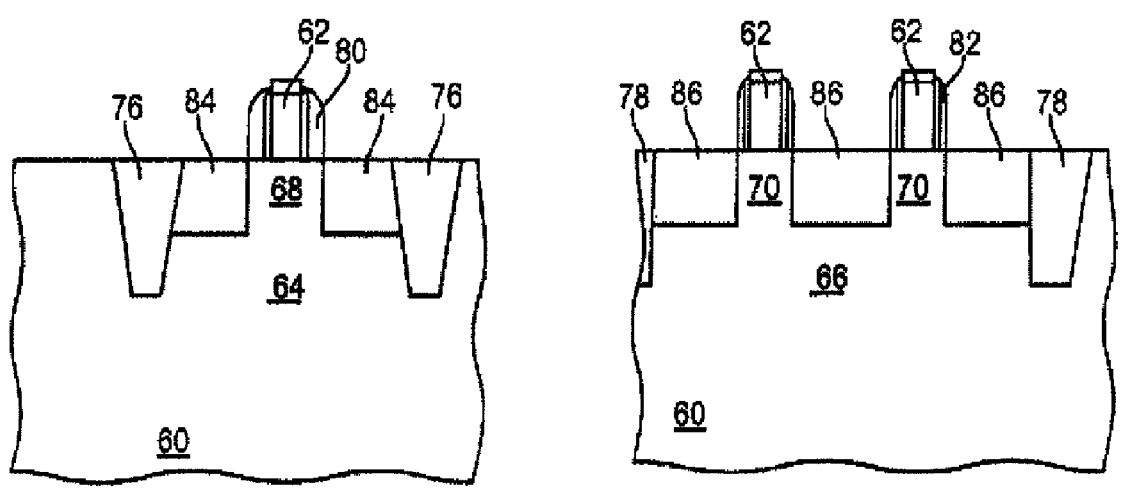

Another process embodiment of the invention is illustrated in FIGS. 5 and 6. In this illustrative embodiment, strain is induced in the channel regions of MOS transistors by the formation of embedded epitaxial regions in the substrate adjacent the channel regions of the transistors.

Illustrated in FIG. 5, in cross-section, is a semiconductor substrate 60 having already undergone several processing steps in accordance with illustrative embodiment. Gate electrodes 62 overlie a first substrate region 64 and a second substrate region 66. Gate electrodes 62 overlie a channel region 68 in first substrate region 64 and channel region 70 in second substrate region 66. The gate electrodes also include insulative lines and silicide caps in similarity with the previous embodiment.

Cavities 72 are formed adjacent channel region 68 in first substrate region 64 and cavities 74 are formed adjacent channel region 70 in second substrate region 66. Cavities 72 extend from channel region 68 to isolation regions 76 in first substrate region 64. Correspondingly, some of cavities 74 extend from channel region 70 to isolation regions 78 in second substrate region 66 and other cavities 74 extend between two channel regions.

In accordance with the present embodiment, sidewall spacers 80 are formed adjacent gate electrode 62 in first substrate region 64 and sidewall spacers 82 are formed adjacent the gate electrodes in second substrate region 66. In similarity to the previous embodiment, sidewall spacers 80 have a larger width than sidewall spacers 82. The sidewall spacers can be formed according to the previous embodiment, in which a spacer material is conformally deposited and anisotropically etched at different rates depending upon the population density of gate electrodes on the substrate surface.

In an alternative process embodiment, sidewall spacers 80 and 82 are formed by depositing a layer of silicon nitride on the surface of substrate 60 and overlying gate electrodes 62. The deposition process results the formation of a relatively thicker portion of the silicon nitride layer in regions of the substrate having a relatively high component density, and a relatively thinner portion of the silicon nitride layer in regions of the substrate having a relatively low component density. Upon anisotropic etching of the silicon nitride layer, the width of the sidewall spacers will substantially correspond to the localized thickness of the silicon nitride layer.

The silicon nitride deposition process is preferably carried out by plasma-enhanced-chemical-vapor-deposition (PECVD) of silicon nitride. This type of deposition process exhibits strong loading effects in which the deposited silicon nitride layer in the dense regions is thinner than in the more isolated regions of the substrate. The greater layer thickness results in a larger spacer. In addition to PECVD processes, other deposition techniques can be used to deposit the silicon nitride layer. For example, low-pressure-CVD (LPCVD) processes using bis(tert-butylamino)silane (BTBAS) or hexachlorodisilane (HCD) as a silicon nitride source, and rapid-thermal-CVD (RTCVD) deposition methods can also be carried out under loading effect conditions to deposit materials such as silicon nitride to a varying thickness depending upon feature density.

Once sidewall spacers 80 and 82 are formed, a substrate etching process is carried out to form cavities 72 and 74 using the sidewall spacers and isolation region 76 and 78 as etching masks. In one embodiment, the regions of substrate 60 to be etched are doped with a conductivity-determining dopant prior to carrying out the etching process. Further, doped regions in channel region 68 and 70 can be formed upon completion of the cavity formation process. In one embodiment, an angled ion implantation process is carried out to form doped regions, such as halo regions, source-drain extension regions, and the like in the channel region of first and second substrate region 64 and 66.

After forming cavities 72 and 74, and performing any optional ion implantation processes, an epitaxial deposition process is carried out to form epitaxial regions 84 in cavity 72 and epitaxial regions 86 in cavities 74. By forming epitaxial regions in the substrate adjacent the gate electrodes, strain is introduced into channel regions 68 and 70 as a result of a difference in the lattice constant between the epitaxial regions and the silicon substrate material. In one embodiment, gate electrodes 62 will serve as gate electrodes for P-type transistors. Accordingly, strain is induced in channel regions 68 and 70 by forming one or more of silicon-germanium (SiGe), silicon-germanium-tin (SiGeSn), silicon-tin (SiSn), or silicon-germanium-carbon (SiGeC), or the like in regions in substrate 60. Alternatively, where gate electrodes 62 function as gate electrodes for N-type transistors, silicon-carbide (SiC), or the like, is deposited to form epitaxial regions 84 and 86.

Since the width of sidewall spacers 80 is greater than the width of sidewall spacers 82, epitaxial regions 86 reside in closer proximity to gate electrode 62 in second substrate region 66 than do epitaxial regions 84 in first substrate region 64. Because of the proximity differences, the degree of strain induced in channel region 70 differs from that induced in channel region 68. Accordingly, the electrode performance of the transistors can be made substantially uniform by spacing the epitaxial regions away from the channel regions of transistors having a relatively low population density, while fabricating epitaxial regions in closer proximity to the channel regions of transistors having a relatively high population density.

Figure 1A:
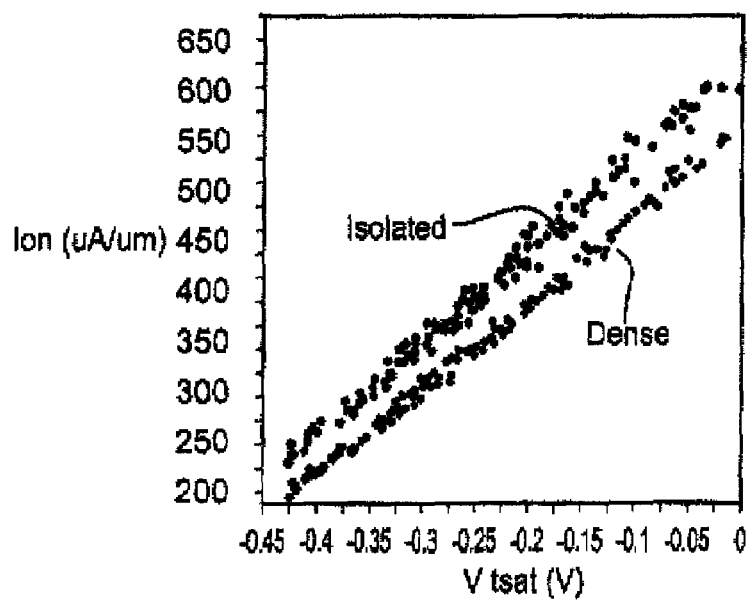
FIG. 1(a) is a plot of on-current versus threshold saturation voltage for isolated verses densely populated transistors fabricated in accordance with the prior art.
Figure 1B:
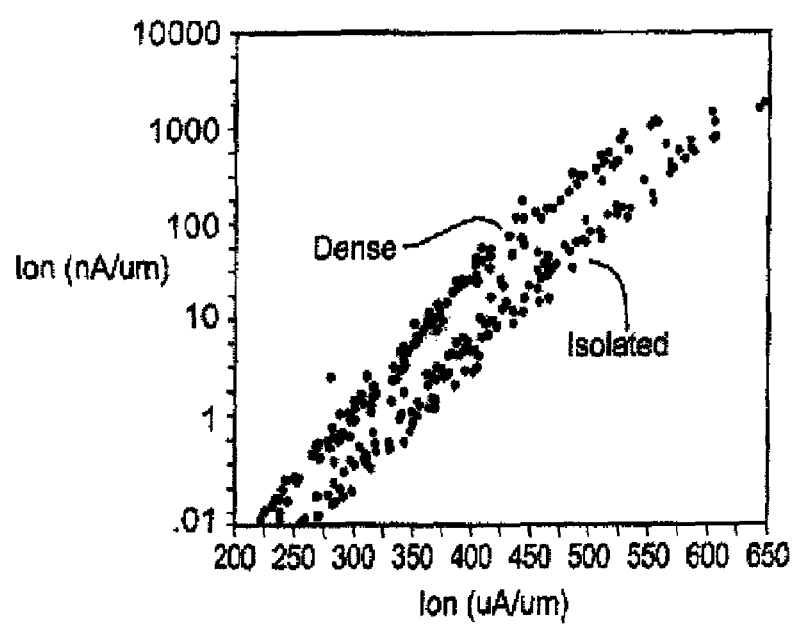
FIG. 1(b) is a plot of off-current versus on-current for isolated versus densely populated transistors fabricated in accordance with the prior art.
Figure 2:
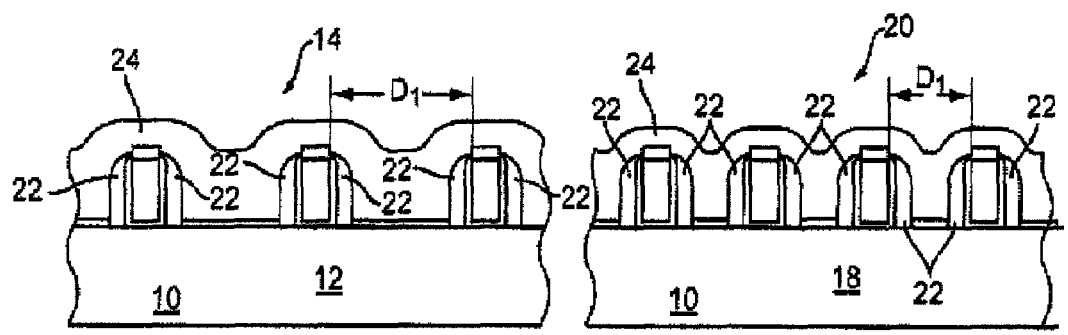
FIG. 2 illustrates, in cross-section, a device region having a low density of MOS transistors and a device region having a dense population of MOS transistors fabricated in accordance with the prior art.

The foregoing embodiments of the invention provide semiconductor devices, such as MOS transistors, that have uniformly-enhanced, strain-induced electrical performance. The various fabrication methods of the invention function to normalize the effects of inducing strain in the channel regions of MOS transistors, such that the transistor performance is independent of transistor population density. Accordingly, uniform device performance can be realized in substantially all of the device components in an integrated circuit. Consequently, the layout dependence of electrical parameters, such as those illustrated in the plots of FIG. 1, can be substantially reduced by fabricating devices in accordance with the various embodiments of the invention.

Thus, it is apparent that there has been described, in accordance with the invention, methods for normalizing stress in a semiconductor device that fully provides the advantages set forth above. Although the invention has been described and illustrated in reference to specific illustrative embodiments thereof, it is not intended that the invention be limited to those illustrative embodiments. Those skilled in the art will recognize that variations and modifications can be made without departing from the spirit of the invention. For example, numerous processing techniques, such as deep-UV and X-ray lithography can be used to fabricate devices according to the invention. Further, various materials, such as the refractory metals, refractory metals silicides, ceramic materials, high-K-dielectric materials, and the like can be used. It is therefore intended to include within the invention all such variations and modifications as fall within the scope of the appended claims and equivalents thereof.

The invention claimed is:

1. A method for fabricating strained-channel semiconductor devices having a varying transistor population density, the method comprising:
    providing a substrate having a first region including transistors and a second region including transistors, wherein the first region is more densely populated with transistors than the second region;
    forming a stress-inducing region in proximity to a channel region of the transistors; and
    forming sidewall spacers on the transistors to selectively space the stress-inducing regions in the first and second substrate regions away from the channel regions of the transistors, wherein the sidewall spacers in the second region have a lateral dimension that is larger than a lateral dimension of the sidewall spacers in the first region,
    such that the stress-inducing regions are selectively spaced away from the channel regions of the transistors so as to adjust a drive current of the transistors in more densely populated regions to be substantially the same as a drive current of the transistors in less densely populated regions of the substrate.

2. The method of claim 1, wherein forming sidewall spacers comprises depositing silicon nitride and anisotropically etching the silicon nitride.

3. The method of claim 1, wherein forming a stress-inducing regions comprises forming epitaxial regions in the substrate, wherein the epitaxial regions are spaced apart from the transistors by the sidewall spacers.

4. The method of claim 3 further comprising forming implant regions in the epitaxial regions.

5. The method of claim 3, wherein forming epitaxial regions comprises forming 1 of SiGe, SiGeSn, SiSn, SiGeC or SiC.

6. The method of claim 1 further comprising forming implant regions in the substrate.

7. The method of claim 1, wherein forming sidewall spacers comprises depositing a layer of spacer forming material over the transistors, and etching the spacer forming material in the first region at a faster etch rate than in the second region.

8. The method of claim 7 further comprising forming a strain-inducing layer overlying the substrate, wherein the strain-inducing layer is spaced apart from the transistors by the sidewall spacers.

9. The method of claim 1, wherein providing a substrate having a first region including transistors and a second region including transistors comprises providing a substrate having MOS transistor gate electrodes in the first and second regions.

10. A method for normalizing stress effects in a semiconductor device substrate populated with strained-channel transistors, the method comprising:
    providing a substrate populated by relatively high density transistors and relatively low density transistors; and
    forming a strain-inducing material in the substrate in proximity to the channel region of the transistors,
    wherein the strain-inducing material is in closer proximity to the channel regions in the relatively high density transistors than in the relatively low density transistors,
    such that a drive current of the relatively high density transistors is substantially the same as a drive current of the relatively low density transistors.

11. The method of claim 10, wherein forming a strain-inducing material comprises forming epitaxial regions in the substrate.

12. The method of claim 10 further comprising forming sidewall spacers on the transistors, wherein the sidewall spacers on the relatively low density transistors have a lateral dimension that is larger than a lateral dimension of the sidewall spacers on the relatively high density transistors.

13. The method of claim 10, wherein providing a substrate populated by relatively high density transistors and relatively low density transistors comprises providing a substrate at least partially populated with P-type transistors.

14. The method of claim 13, wherein a current gain of the P-type transistors is substantially the same.

15. A method for fabricating strained-channel semiconductor devices comprising:
    providing a substrate including N-type transistors and P-type transistors,
    wherein a first region of the substrate is more densely populated with transistors than a second region of the substrate;
    forming sidewall spacers on gate electrodes of the transistors,
    wherein the sidewall spacers in the second region have a lateral dimension that is larger than a lateral dimension of the sidewall spacers in the first region; and
    forming a strain-inducing material in the substrate in proximity to channel regions of the transistors, wherein the strain-inducing material is spaced apart from the channel regions by a distance in the substrate equivalent to a lateral distance of the sidewall spacers on a surface of the substrate,
    such that a drive current of the transistors in the first region of the substrate is substantially the same as a drive current of the transistors in the second region of the substrate.

16. The method of claim 15, wherein forming a strain-inducing material comprises forming an epitaxial material comprising one of SiGe, SiGeSn, SiSn, or SiGeC in the substrate in proximity to the gate electrodes of the P-type transistors.

17. The method of claim 15, wherein forming a strain-inducing material comprises forming an epitaxial SiC material in the substrate in proximity to the gate electrodes of the N-type transistors.

18. The method of claim 15, wherein forming sidewall spacers comprises depositing silicon nitride and anisotropically etching the silicon nitride.

19. The method of claim 15, wherein forming sidewall spacers comprises depositing a layer of spacer forming material over the gate electrodes, and etching the spacer forming material in the first region at a faster etch rate than in the second region.

* * * * *